United States Patent
Rangarajan et al.

(10) Patent No.: US 6,352,817 B1
(45) Date of Patent: Mar. 5, 2002

(54) METHODOLOGY FOR MITIGATING FORMATION OF T-TOPS IN PHOTORESIST

(75) Inventors: Bharath Rangarajan, Santa Clara; Bhanwar Singh, Morgan Hill; Steven Avanzino, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/422,592

(22) Filed: Oct. 21, 1999

(51) Int. Cl.$^7$ ................................................. G03C 5/00
(52) U.S. Cl. ...................... 430/311; 430/313; 430/317; 430/329; 438/690; 438/692; 438/697
(58) Field of Search ................................ 430/311, 313, 430/317, 329; 216/79; 438/690, 692, 697

(56) References Cited

U.S. PATENT DOCUMENTS

| | | | |
|---|---|---|---|
| 5,470,693 A | * 11/1995 | Sachdev et al. | ............ 430/315 |
| 5,685,895 A | 11/1997 | Hagiwara et al. | ............ 96/117 |
| 5,704,987 A | * 1/1998 | Huynh et al. | ................. 134/6 |
| 5,731,132 A | 3/1998 | van Werden et al. | ....... 430/331 |
| 6,174,820 B1 | * 1/2001 | Habermehe et al. | ........ 438/745 |
| 6,228,772 B1 | * 5/2001 | Howard et al. | ............. 438/697 |
| 6,232,231 B1 | * 5/2001 | Sethursman et al. | ........ 438/691 |
| 6,242,354 B1 | * 6/2001 | Thomas | ...................... 438/696 |

* cited by examiner

Primary Examiner—Janet Baxter
Assistant Examiner—Amanda C. Walke
(74) Attorney, Agent, or Firm—Amin & Turocy, LLP

(57) ABSTRACT

The present invention relates to a method for mitigating T-tops and/or stringers and/or crusts in a structure. A photoresist layer of the structure is exposed. The structure further includes an underlayer under the photoresist layer, and a substrate under the underlayer. A chemical mechanical polishing process is employed to remove a predetermined thickness of the photoresist layer. An underlayer etch is performed to remove select portions of the underlayer.

18 Claims, 5 Drawing Sheets

METHODOLOGY FOR MITIGATING FORMATION OF T-TOPS IN PHOTORESIST

TECHNICAL FIELD

The present invention generally relates to a method for mitigating the formation of T-tops and/or upper surface stringers and/or crusts in a photoresist.

BACKGROUND OF THE INVENTION

In the semiconductor industry, there is a continuing trend toward higher device densities. Fabrication of very large scale integrated circuits (VLSI) and ultra large scale integrated circuits (ULSI) requires that resist materials, lithographic processes, and exposure tools meet necessary performance demands for high throughput manufacturing of sub-micron feature size devices. In particular, the semiconductor industry is producing with increasing frequency integrated circuits having structures which are markedly less than 1 $\mu$m. The increased integration density increases the requirements imposed on the photolithographic process.

For exposure apparatuses using short-wavelength light such as an excimer laser, chemical amplification type photoresists are often employed. The chemical amplification type photoresist generally consists of a resin, a photosensitive acid generator, and a solubilizer or a cross-linking agent. The acid generator generates an acid upon exposure. During post exposure baking (PEB), this acid functions as a catalyst to encourage the reaction of the solubilizer or the cross-linking agent, and a pattern is formed by development. A photoresist using the solubilizer forms positive patterns, and a photoresist using the cross-linking agent forms negative patterns.

Unfortunately, the chemical amplification type photoresist lacks stability, although it is superior in resolution, since in PEB the catalytic action of an acid generated by exposure is difficult to control. Especially in the case of positive photoresist, if a basic gas such as ammonia gas or amine gas is present in the atmosphere between an exposure apparatus and a PEB apparatus, an acid generated by exposure reacts with this basic gas and is neutralized. Consequently, a portion which is supposed to dissolve in a developer become difficult to dissolve (e.g., a so-called hard dissolution phenomenon takes place). If this hard dissolution layer is formed, a so-called T-top phenomenon occurs in which a pattern formed by development is given a T-shape having an overhang in the upper portion. FIG. 1a schematically illustrates a structure 10 including a photoresist layer 18 over an underlayer 20 (e.g., metal layer, nitride layer, polysilicon layer), which lies over a substrate 22. FIG. 1b illustrates the structure 10 after being exposed. The photoresist layer 18 includes exposed portions 28, which are intended to be dissolved. The exposed portions include hard to dissolve portions 30 which may lead to T-tops and/or stringers and/or crusts. FIG. 1c. Illustrates the structure 10 after a development process was performed thereon. As a result of the hard-dissolution problem, the developed photoresist layer 18 includes T-tops 32 and upper surface stringers 34. The T-tops 32 are the result of a sparingly soluble skin which results in a T-profile of the resist edges after development. T-topping, stringers and crusts interfere with inspection of line width and/or line spacing, and in a subsequent dry etching process affect the dimensionally faithful transfer of the dimensions of the resist structures into the underlayer 20.

In view of the above, it would be desirable to have a method to eliminate or mitigate the presence of T-tops and/or upper surface stringers and/or crusts.

SUMMARY OF THE INVENTION

The present invention provides for a method which eliminates or mitigates the presence of T-tops and/or upper surface stringers and/or crusts. After a photoresist layer has been exposed, a chemical mechanical polishing (CMP) process is performed on the photoresist layer to remove portions of the photoresist that might result in T-tops and/or upper surface stringers and/or crusts in the photoresist layer after development. After the CMP process is complete, the photoresist layer is employed as an etch mask for the underlying layer (e.g., polysilicon layer, metal layer, silicon nitride layer, or oxide layer). The elimination or mitigation of the T-tops and/or upper surface stringers and/or crusts from the photoresist layer via the CMP process substantially facilitates proper transfer of features of the photoresist layer to the underlayer.

One particular aspect of the present invention relates to a method for mitigating formation of T-tops and/or stringers from a structure. A photoresist layer of the structure is developed—the structure includes an underlayer under the photoresist layer, and a substrate under the underlayer. A chemical mechanical polishing process is performed to remove a portion of the photoresist layer, the portion including a difficult to dissolve which might lead to the formation of at least one of a T-top and/or a stringer.

Another aspect of the present invention relates to a method for mitigating formation of T-tops and/or stringers and/or crusts in a structure. A photoresist layer of the structure is exposed. The structure further includes an underlayer under the photoresist layer, and a substrate under the underlayer. A chemical mechanical polishing process is employed to remove a predetermined thickness of the photoresist layer. An underlayer etch is performed to remove select portions of the underlayer.

Another aspect of the present invention relates to a method for mitigating formation of T-tops and/or stringers and/or crusts in a structure. A photoresist layer of the structure is exposed, the structure further includes an underlayer under the photoresist layer, and a substrate under the underlayer. A means to remove a predetermined thickness of the photoresist layer is employed. An underlayer etch is performed to remove select portions of the underlayer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
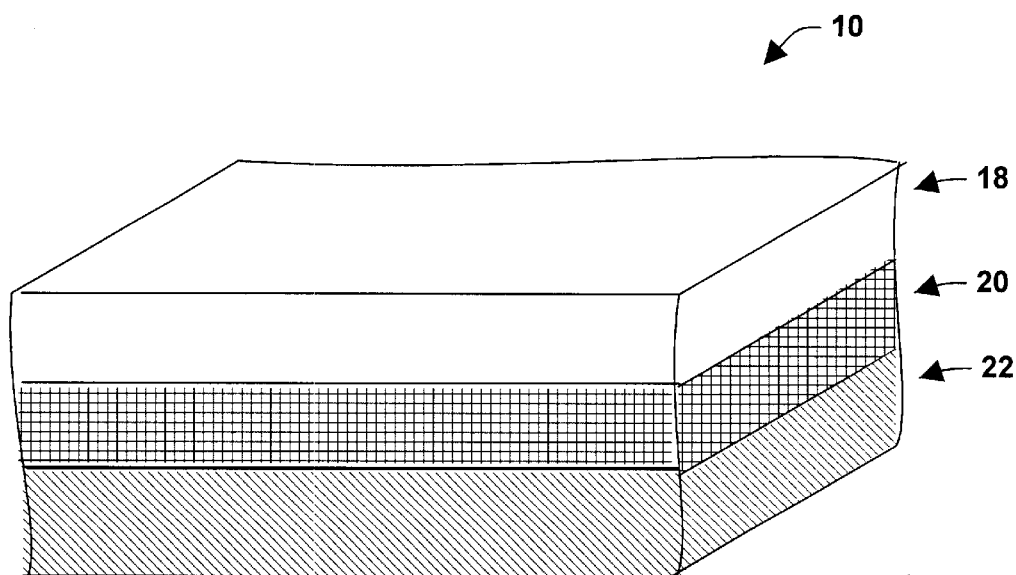
FIG. 1a is a schematic perspective illustration of a structure including a photoresist layer, an underlayer and a substrate.
Figure 1B:
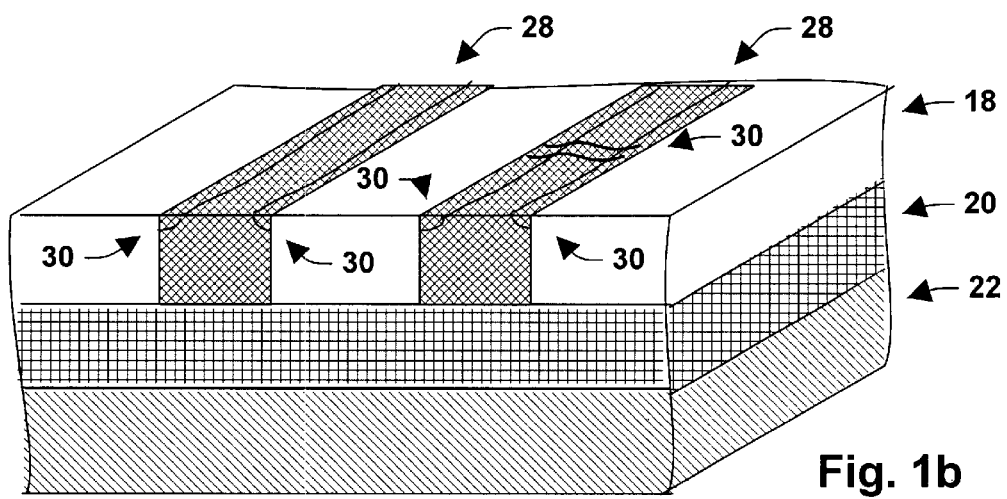
FIG. 1b is a schematic perspective illustration of the structure of FIG. 1a after the photoresist layer has been exposed.
Figure 1C:
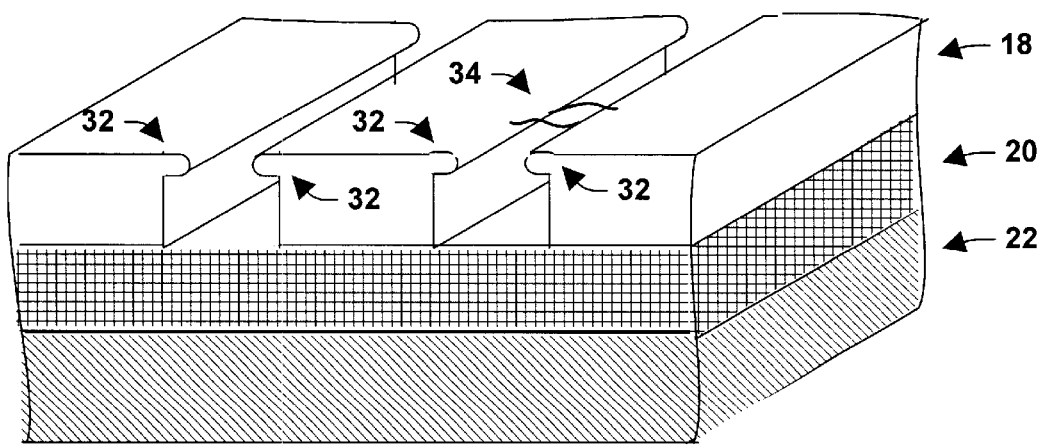
FIG. 1c is a schematic perspective illustration of the structure of FIG. 1a after the photoresist layer has been developed.

The present invention will now be described with reference to the drawings, wherein like reference numerals are used to refer to like elements throughout.

Figure 2:
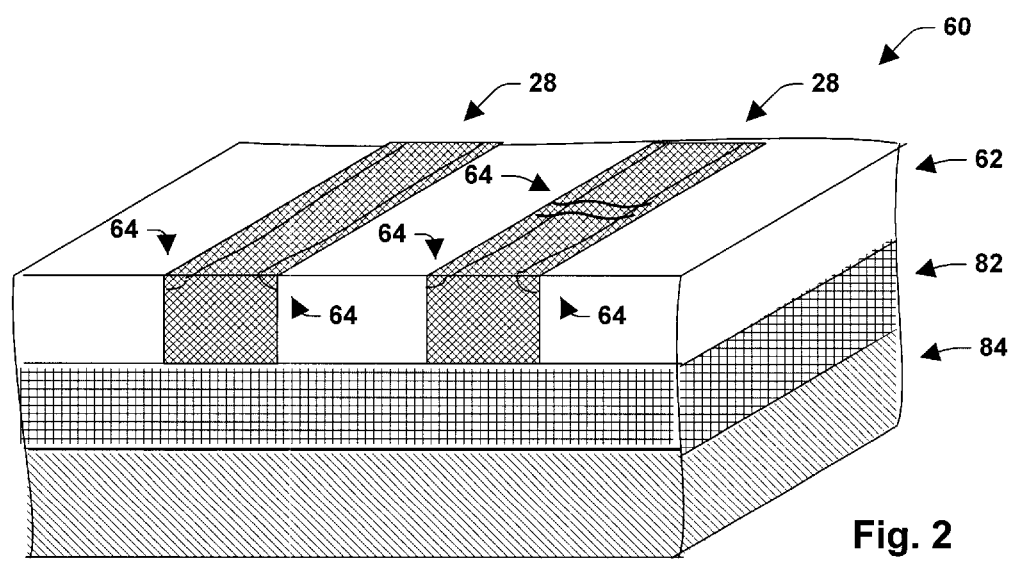
FIG. 2 is a schematic perspective illustration of a structure after a photoresist layer has been exposed in accordance with the present invention.

FIG. 2 schematically illustrates a structure 60 after a photoresist exposure process has been performed thereon. The structure 60 includes an exposed photoresist layer 62 having hard to develop portions 64 which may lead to formation of T-tops and/or stringers. The structure 60 also includes an underlayer 82 (e.g., polysilicon layer, metal layer, silicon nitride layer, or oxide layer), which is to be etched. The underlayer 82 ties over a substrate 84.

Figure 3:
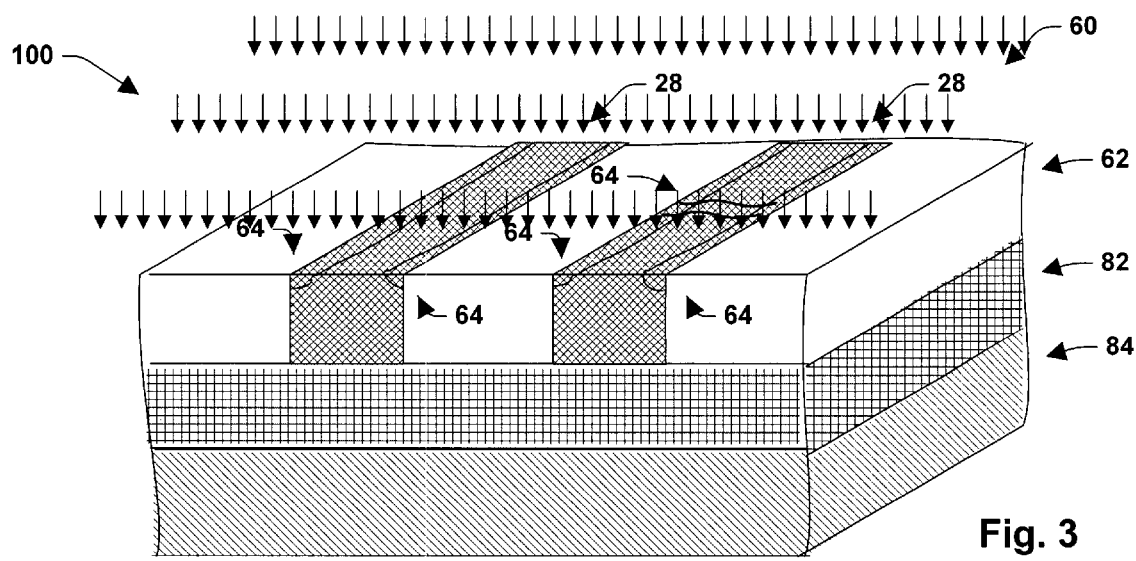
FIG. 3 is a schematic perspective illustration of the structure of FIG. 2 undergoing a chemical mechanical process (CMP) to remove a predetermined thickness of the photoresist layer in accordance with the present invention.

FIG. 3 schematically illustrates the structure 60 undergoing a chemical mechanical polishing (CMP) step 100 to remove a predetermined thickness of the photoresist layer 62 so as to remove the hard to develop portions 64 which may lead to the formation of T-tops and/or stringers and/or crusts. The CMP process 100 preferably removes about 100 Å–500 Å of the photoresist layer 62, which corresponds to a thickness of the hard to develop portions 64. It is to be appreciated that the CMP process described herein may be suitable tailored to remove a desired thickness of the photoresist layer 62 to eliminate the T-tops 64 and/or stringers 68 and/or crusts (not shown). It is to be appreciated that any suitable CMP methodology or other suitable technique for removing a desired thickness of the photoresist layer 62 in accordance with the present invention as defined by the hereto appended claims may be employed.

The CMP process 100 of the present invention provides for controlled removal of desired amounts of the photoresist layer 62 that results in a remaining photoresist layer of accurate thickness and low non-uniformity. To accomplish the CMP process 100, a chemical agent is applied to the structure 60 with the capability to react with the photoresist 62 in the surface/subsurface range. The degree of reaction should not be great enough to cause rapid or measurable dissolution of the photoresist 62, but should modify chemical bonding in the resist surface layer to facilitate surface layer removal by applied mechanical stress. Although numerous chemicals that attack photoresist may be considered, the present invention makes use of the fact that solutions of a strong base (e.g., KOH or $(CH_3)_4NOH$) will react with the photoresist, the rate and extent of reaction depending on the base concentration. A second parameter for successful photoresist CMP is the application of mechanical stress. Photoresist resins are soft materials that easily undergo plastic deformation. Care must be taken in choosing a polishing surface. The polishing pad should be a soft, compressible material of uniform density. Preferably, the polishing pad material is highly porous, both for compressibility and so as to deliver liquid medium to and photoresist by-products away from the structure surface. The polishing pad should exhibit high surface area contact with the structure 60 so that load stresses are uniformly distributed over the polished surface. One example of a preferred polishing pad is a foamed, urethane pad manufactured by Rodel, Inc. designated as Politex Supreme, embossed. It is to be appreciated that any polishing pad suitable for carrying out the present invention may be employed and is intended to fall within the scope of the hereto appended claims.

The use of abrasive particles in the form of a slurry (a typical feature of conventional CMP) is unnecessary when polishing a soft, readily soluble substance such as photoresist. Accordingly, a preferred liquid polishing medium employed in accordance with the present invention comprises an aqueous solution with substantially no abrasive content, and a non-ionic polyethylene oxide type surfactant, Triton X100, at a 200 ppm concentration level. Mechanical stresses are applied directly to the photoresist layer by the polymeric surface of the polishing pad.

Preferred polishing parameters fall within about the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

Experimental results indicate that a downforce of about 2 psi is preferred.

After the CMP process 100 is substantially complete, the surface of the structure 60 is cleaned using suitable techniques.

Figure 4:
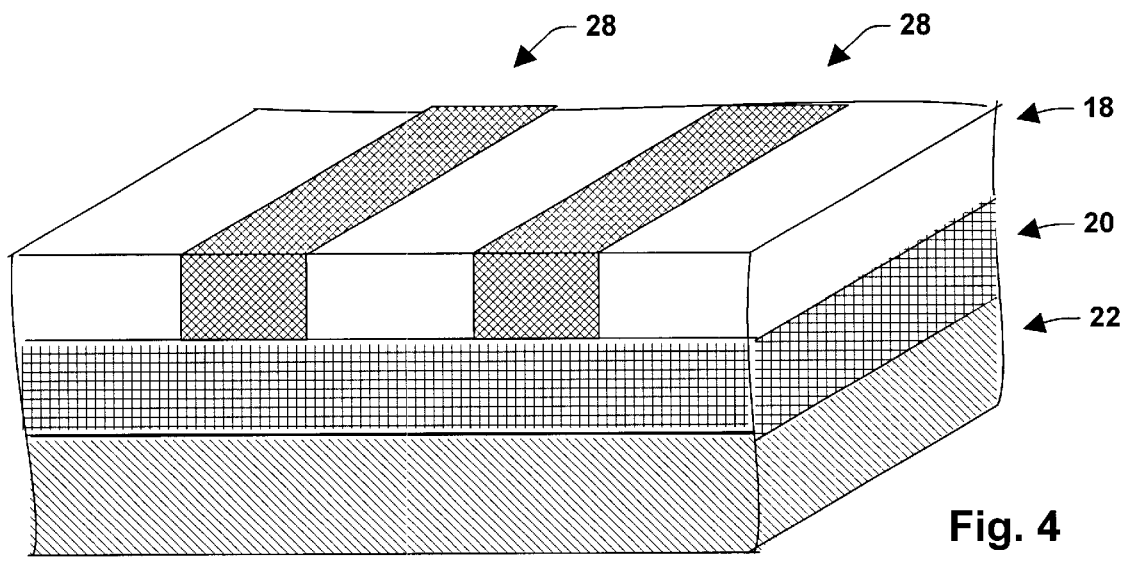
FIG. 4 is a schematic perspective illustration of the structure of FIG. 3 after the CMP is substantially complete in accordance with the present invention.

FIG. 4 illustrates the structure 60 after the CMP process 100 is complete. The CMP process 100 removed a predetermined thickness of the photoresist layer 62 including the hard to develop portions 64.

Figure 5:
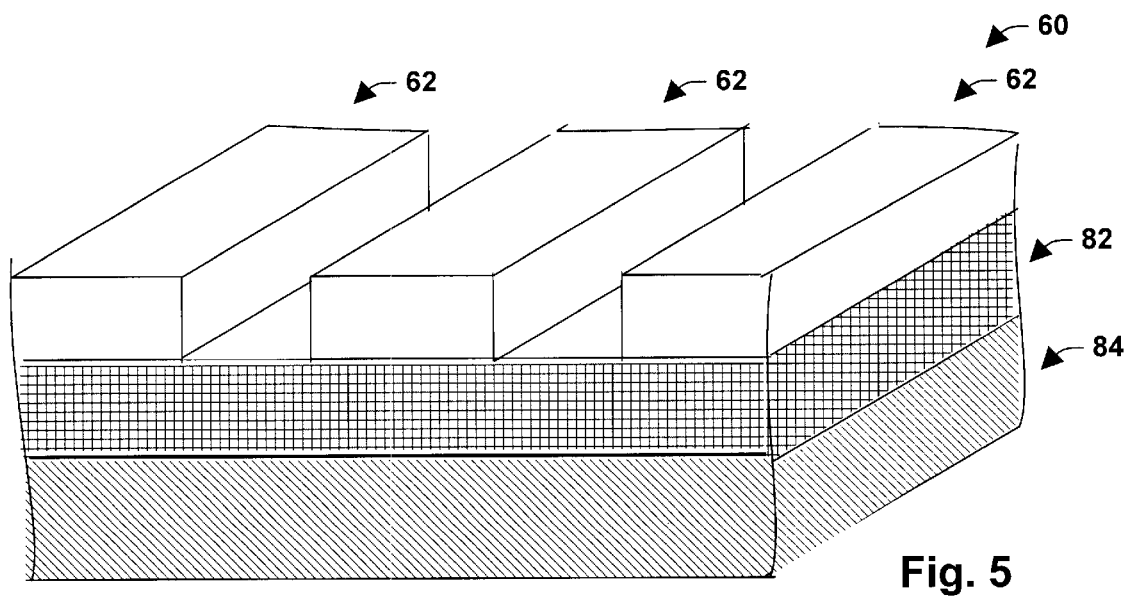
FIG. 5 is a schematic perspective illustration of the structure of FIG. 4 after the photoresist layer has been developed in accordance with the present invention.

FIG. 5 illustrates the structure 60 after the photoresist layer 62 underwent development to remove exposed portions. As can be seen, the structure 60 is free of T-tops, stringers and crusts which may have formed if the hard to develop portions 64 were not removed by the CMP process 100.

Figure 6:
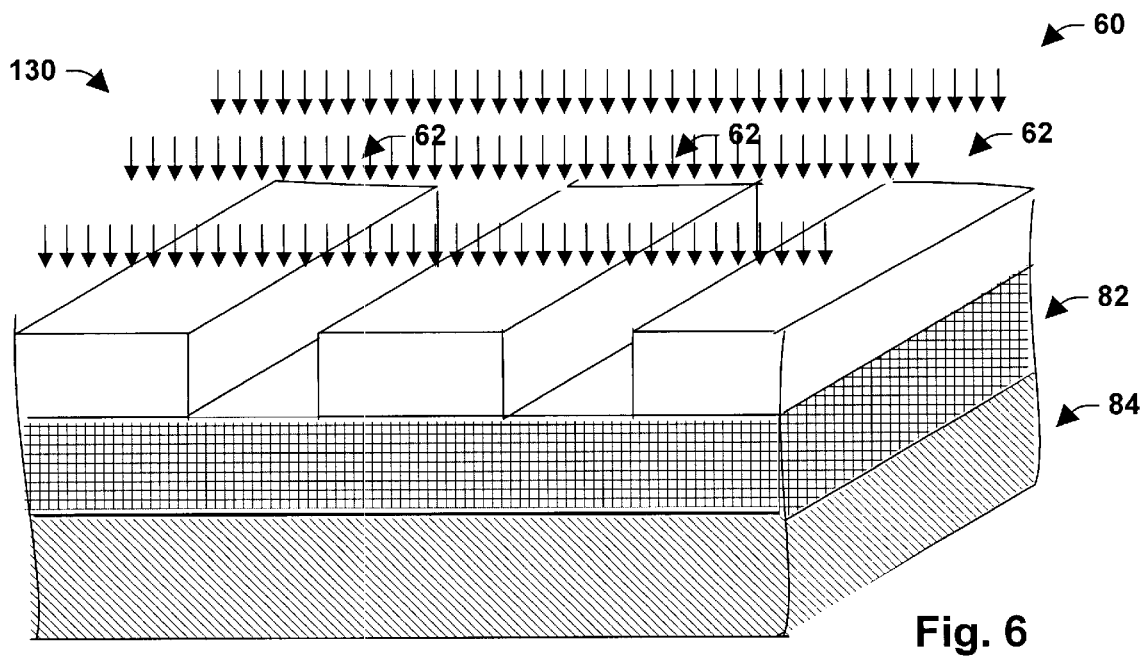
FIG. 6 is a schematic perspective illustration of the structure of FIG. 5 undergoing an etch step to etch an underlayer in accordance with the present invention.
Figure 7:
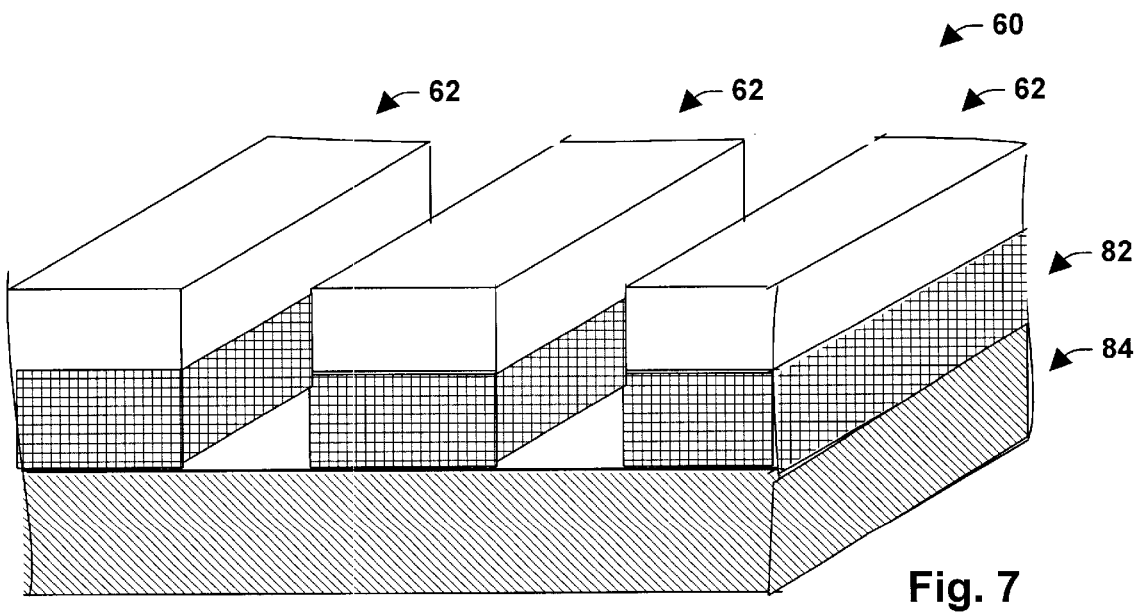
FIG. 7 is a schematic perspective illustration of the structure of FIG. 6 after the underlayer etch step is complete in accordance with the present invention.
Figure 8:
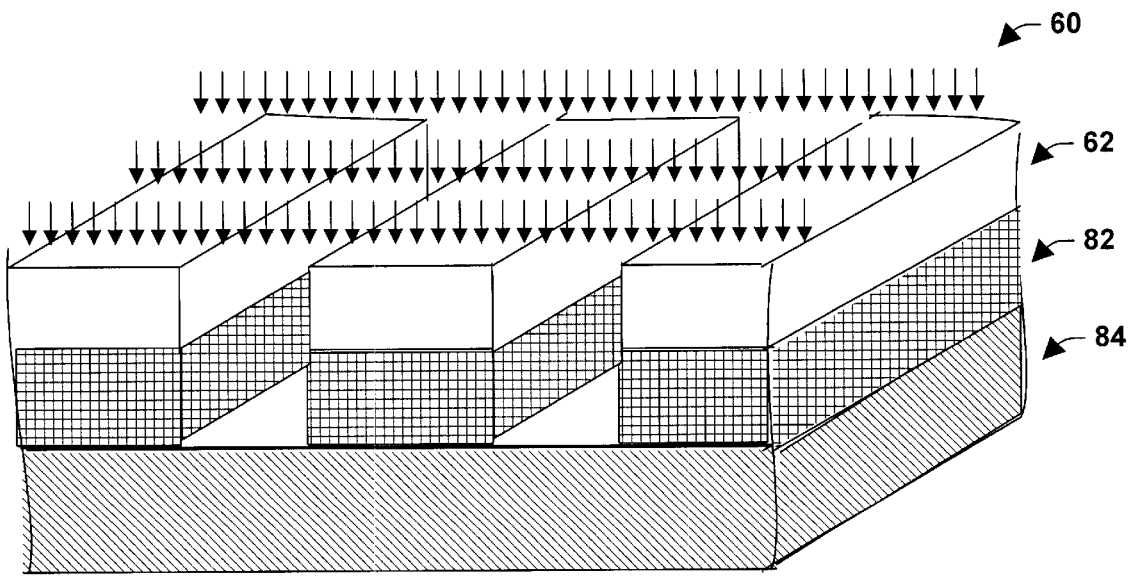
FIG. 8 is a schematic perspective illustration of the structure of FIG. 7 after a stripping process has been performed to remove photoresist layer portions from the etched underlayer in accordance with the present invention.
Figure 9:
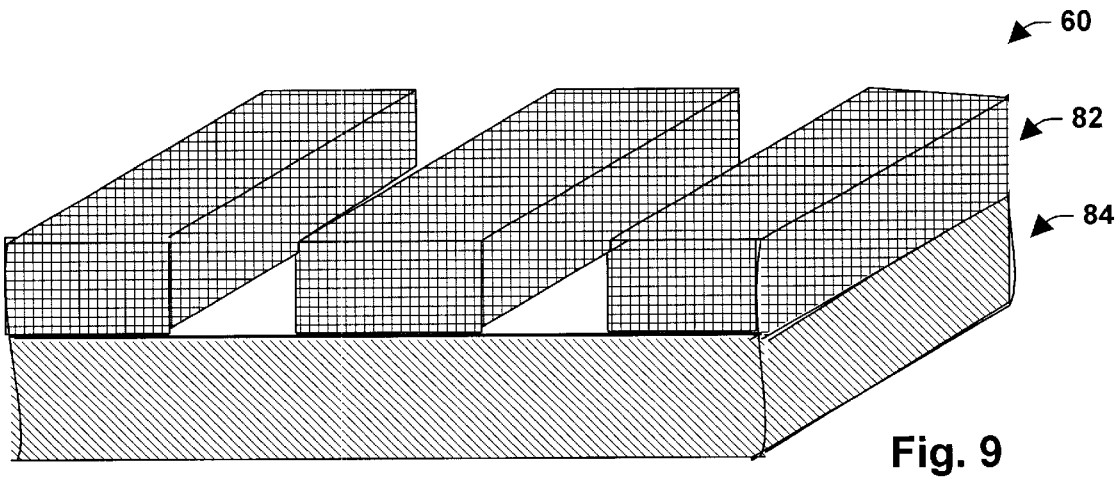
FIG. 9 is a schematic perspective illustration of the structure of FIG. 8 after the photoresist stripping process is complete in accordance with the present invention.

FIG. 6 illustrates of the structure 60 undergoing an etch step 130 to etch the underlayer 82 in accordance with the present invention. FIG. 7 illustrates the structure 60 after the underlayer etch step 130 is complete. FIG. 8 illustrates a stripping process 150 being performed on the structure 60 to remove photoresist layer portions 62 from the etched underlayer 82. FIG. 9 illustrates the structure 60 after the photoresist stripping process 150 is complete in accordance with the present invention.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for mitigating formation of T-tops and/or stringers in a structure, comprising the steps of:

exposing a photoresist layer of the structure, the structure further including an underlayer under the photoresist layer, and a substrate under the underlayer; and employing a chemical mechanical polishing process to remove a portion of the photoresist layer, the portion including at least one hard to develop portion which could lead to formation of a T-top and/or a stringer wherein the removed portion of the photoresist layer has a thickness falling within the range of about 100 Å to 500 Å.

2. The method of claim 1 further including the step of employing a polishing solution including at least one of KOH and $(CH_3)_4NOH$.

3. The method of claim 2, the polishing solution further including a non-ionic polyethylene oxide type surfactant.

4. The method of claim 1 further including the step of employing a polishing pad with a polymeric surface.

5. The method of claim 1 further including the step of rotating a polishing pad at a predetermined speed to facilitate removal of a desired amount of the photoresist layer.

6. The method of claim 1 further including polishing parameters falling within the range of:

| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| PolisH time | 30–360 sec. |

7. A method for mitigating formation of T-tops and/or stringers and/or crusts in a structure, comprising the steps of:

exposing a photoresist layer of the structure, the structure further including an underlayer under the photoresist layer, and a substrate under the underlayer; and employing a chemical mechanical polishing process to remove a predetermined thickness of the photoresist layer wherein the removed portion of the photoresist layer has a thickness falling within the range of about 100 Å to 500 Å; and performing an underlayer etch to remove select portions of the underlayer.

8. The method of claim 7 further including the step of employing a polishing solution including at least one of KOH and $(CH_3)_4NOH$.

9. The method of claim 8, the polishing solution further including a non-ionic polyethylene oxide type surfactant.

10. The method of claim 7 further including the step of employing a polishing pad with a polymeric surface.

11. The method of claim 7 further including the step of rotating a polishing pad at a predetermined speed to facilitate removal of a desired amount of the photoresist layer.

12. The method of claim 7 further including polishing parameters falling within the range of:

| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

13. A method for mitigating formation of T-tops and/or stringers and/or crusts in a structure, comprising the steps of:

exposing a photoresist layer of the structure, the structure further including an underlayer under the photoresist layer, and a substrate under the underlayer; and employing a means to remove a predetermined thickness of the photoresist layer wherein the removed portion of the photoresist layer has a thickness falling within the range of about 100 Å to 500 Å; and performing an underlayer etch to remove select portions of the underlayer.

14. The method of claim 13 further including a step of employing a polishing solution including at least one of KOH and $(CH_3)_4NOH$.

15. The method of claim 14, the polishing solution further including a non-ionic polyethylene oxide type surfactant.

16. The method of claim 13 further including a step of employing a polishing pad with a polymeric surface.

17. The method of claim 13 further including a step of rotating a polishing pad at a predetermined speed to facilitate removal of a desired amount of the photoresist layer.

18. The method of claim 13 further including polishing parameters falling within the range of:

| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

* * * * *